United States Patent [19]
Glascock, II

[11] Patent Number: 5,133,795
[45] Date of Patent: * Jul. 28, 1992

[54] METHOD OF MAKING A SILICON PACKAGE FOR A POWER SEMICONDUCTOR DEVICE

[75] Inventor: Homer H. Glascock, II, Scotia, N.Y.
[73] Assignee: General Electric Company, Schenectady, N.Y.
[*] Notice: The portion of the term of this patent subsequent to May 17, 2005 has been disclaimed.
[21] Appl. No.: 681,284
[22] Filed: Apr. 8, 1991

Related U.S. Application Data

[60] Division of Ser. No. 428,807, Oct. 30, 1989, Pat. No. 5,034,044, which is a continuation-in-part of Ser. No. 193,318, May 11, 1988, abandoned, which is a continuation-in-part of Ser. No. 926,936, Nov. 4, 1986, abandoned.

[51] Int. Cl.$^5$ .............................................. C03B 23/20
[52] U.S. Cl. .................................... 65/42; 65/36; 65/58; 437/213
[58] Field of Search ............... 65/36, 42, 58; 437/209, 437/213, 925, 6; 29/613, 855, 850

[56] References Cited

U.S. PATENT DOCUMENTS

| | | | |
|---|---|---|---|
| 3,354,258 | 11/1967 | Saia et al. | 174/52 |
| 3,475,663 | 10/1969 | Boyer | 437/213 |
| 3,501,833 | 3/1970 | Spiegler | 29/627 |
| 3,566,205 | 2/1971 | Walker et al. | 437/218 |
| 3,591,837 | 7/1971 | Boyer | 357/73 |
| 3,643,136 | 2/1972 | Tuft | 317/234 |
| 3,742,599 | 7/1973 | Desmond et al. | 437/217 |
| 3,768,991 | 10/1973 | Rogers | 65/36 |
| 3,885,860 | 5/1975 | Sorkin | 437/219 |
| 3,909,332 | 9/1975 | Yerman | 156/309 |
| 4,235,645 | 11/1980 | Johnson | 65/36 |
| 4,285,714 | 8/1981 | Kirkpatrick | 65/40 |
| 4,329,701 | 5/1982 | Brenneman | 437/218 |
| 4,355,463 | 10/1982 | Burns | 437/217 |
| 4,400,870 | 8/1983 | Islam | 29/588 |
| 4,430,664 | 2/1984 | Matsunaga et al. | 357/73 |
| 4,530,029 | 7/1985 | Beristain | 29/25.42 |
| 4,542,259 | 9/1985 | Butt | 172/52 |
| 4,641,176 | 2/1987 | Keryhuel et al. | 357/74 |
| 4,685,200 | 8/1987 | Bokil | 437/215 |
| 4,745,455 | 5/1988 | Glascock, II et al. | 357/74 |
| 4,769,345 | 9/1988 | Butt et al. | 437/217 |
| 4,839,716 | 6/1989 | Butt | 357/73 |
| 4,905,075 | 2/1990 | Temple et al. | 361/331 |

FOREIGN PATENT DOCUMENTS

| | | |
|---|---|---|
| 2498814 | 7/1982 | France . |
| 53-30274 | 3/1978 | Japan . |
| 55-16464 | 2/1980 | Japan . |
| 5742138 | 3/1981 | Japan . |
| 56-134966 | 10/1981 | Japan . |
| 57-26459 | 2/1982 | Japan . |
| 58-161351 | 9/1983 | Japan . |
| 59-72745 | 4/1984 | Japan . |
| 60-57652 | 4/1985 | Japan . |
| 60-223144 | 11/1985 | Japan . |

OTHER PUBLICATIONS

Robertson, F. A., "Packaging Techniques for Modern Microelectronics Equipment", Electronics and Power, Oct. 1971, pp. 75–86.
Scrupski, S. E., "Plastic-Ceramic Duel Stirs Up New Design Concepts for LSI Packages", Electronics, vol. 44, No. 8, Apr. 12, 1981, pp. 406–409.

Primary Examiner—Kenneth M. Schor
Assistant Examiner—John J. Bruckner
Attorney, Agent, or Firm—Marvin Snyder; James C. Davis, Jr.

[57] ABSTRACT

A method is provided for making a hermetically sealed package for a power semiconductor wafer having substantially entirely silicon materials selected to have coefficients of thermal expansion closely matching that of the power semiconductor wafer. A semiconductor wafer such as a power diode includes a layer of silicon material having first and second device regions on respective sides. An electrically conductive cap and base of silicon are disposed in electrical contact with the first and second regions of the semiconductor device, respectively. An electrically insulative sidewall of silicon glass material surrounds the semiconductor wafer, is spaced from an edge thereof, and is bonded to the cap and base for hermetically sealing the package. The glass sidewall is directly bonded to the base by bringing the base and sidewall into intimate contact under a slight pressure and heating to a temperature at which the glass wets the silicon base but does not soften enough to lose its form, holding this temperature for a holding time and cooling the composite the complete the bond.

10 Claims, 1 Drawing Sheet

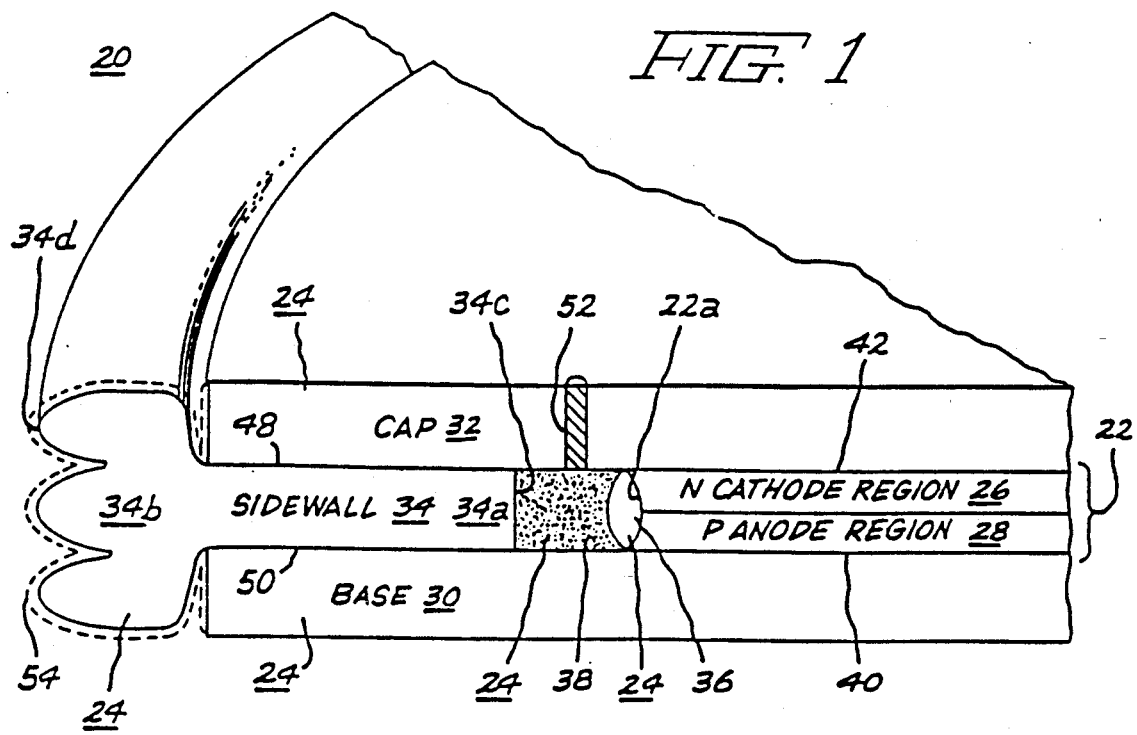
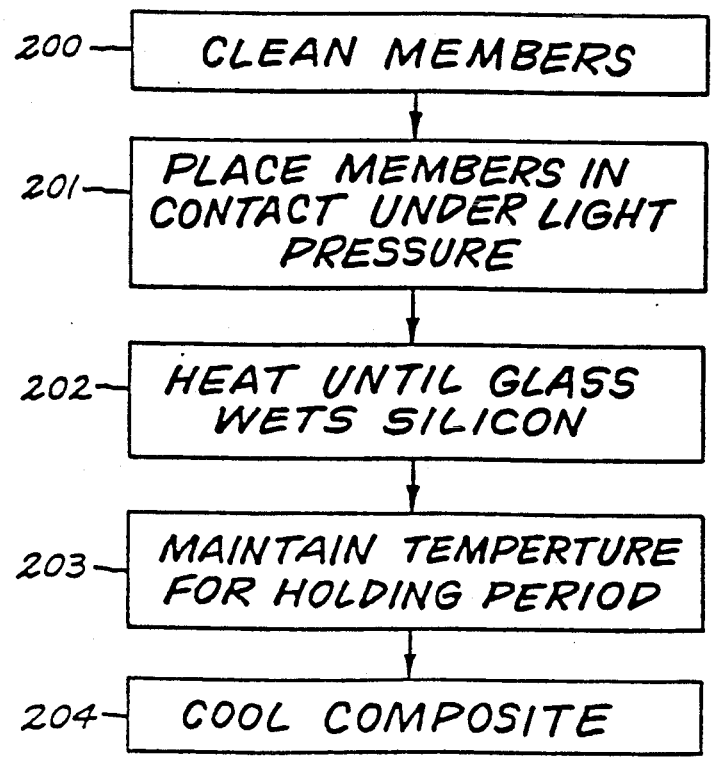

METHOD OF MAKING A SILICON PACKAGE FOR A POWER SEMICONDUCTOR DEVICE

CROSS-REFERENCE TO RELATED APPLICATIONS

This is a division of application Ser. No. 07/428,807, filed Oct. 30, 1989, now U.S. Pat. No. 5,034,044, issued Jul. 23, 1991; which is a continuation-in-part of application Ser. No. 193,318, filed May 11, 1988, and now abandoned; which is in turn a continuation-in-part of application Ser. No. 926,936, filed Nov. 4, 1986, and now abandoned. This specification discloses subject matter related to that disclosed in commonly-assigned application Ser. No. 863,761, filed May 16, 1986, now Glascock, II et al. U.S. Pat. No. 4,745,455, issued May 17, 1988 for "Silicon Packages for Power Semiconductor Devices."

This invention relates generally to a method for bonding glass to silicon, and more specifically, to a method for forming a hermetically sealed, substantially silicon package for a semiconductor device.

BACKGROUND OF THE INVENTION

Packages for power semiconductor wafers must operate in a variety of different environments and must meet many different requirements. Such packages must provide a housing for the wafer which is secure from external environmental influences which might otherwise damage the wafer. They must provide for electrical connections to the wafer in a manner which is convenient and does not compromise the protection from the environment. They must provide a cool thermal environment for the wafer and must contact the wafer with materials which permit the wafer to expand and contract with changes in temperature, without causing excessive stresses in the wafer or supportive material. Such packages are also desirably light in weight, compact in size, and easily fabricated using known technologies.

Prior art packages for power semiconductor wafers typically comprise some combination of metals, plastics and ceramics, each of which compromises one aspect of functionality to emphasize another. For example, high thermal conductivity metals such as copper and aluminum can provide excellent heat removal characteristics, but differ substantially from the silicon wafer in thermal expansion. These metals thus cause thermal fatigue and premature failure at the interfaces between the wafer and package. Some ceramic material may be selected to more closely match the thermal expansion of the wafer, but do not provide for easy electrical connection to the wafer. Some plastic materials may be easily fabricated into various package configurations, but these plastics may not provide for heat removal or electrical connections. In short, while various combinations and types of plastics, metals and ceramics can be used to fabricate packages with selected functional characteristics, each of these materials has its own drawbacks which makes its use in the package to some extent undesirable.

It would be desirable to provide a package for a power semiconductor wafer which provides a hermetic seal from the operating environment, simple electrical connection to the wafer, efficiency of cooling, thermal expansion similar to that of the wafer, low weight and compact size, and which may be fabricated using conventional technology. In the above-noted U.S. Pat. No. 4,745,455, there is disclosed a semiconductor package designed to accomplish the above noted objectives by utilizing substantially entirely silicon materials selected to have coefficients of thermal expansion matching that of the power semiconductor. The package disclosed therein incorporates a silicon glass sidewall which operates to form a hermetic seal for the package by bonding or other attachment to doped silicon layers which serve both as electrical terminals and also as part of an enclosure for the semiconductor.

This invention is directed to an improved method for bonding silicon glass to silicon generally and, in particular, to an improved glass to silicon bonding technique which is useful in the manufacture of the silicon package disclosed in the above-noted patent.

Prior art methods for bonding glass to silicon usually involved laying down a metal layer on the glass by sputtering or other means. The metal can subsequently be bonded to a similar layer on silicon by applying heat and pressure or alternately by soldering. Problems of metallization peeling or solder dewetting commonly arise with such techniques.

Glass has been bonded directly to glass by contacting the members and heating them to about 300° C. in the presence of strong electric fields.

OBJECTS OF THE INVENTION

A principal object of the present invention is to provide a new and improved method for forming or making a hermetically sealed package for a power semiconductor wafer, the package comprising substantially entirely silicon materials.

Another object of the present invention is to provide a method for joining or bonding silicon glass to silicon, which method is both simple to perform and usable in the manufacture of semiconductor packages of the type noted above.

A further object of the present invention is a method for hermetically sealing a silicon package for a power semiconductor wafer, the hermetic seal being formed at least in part by a direct bond between a silicon glass and a silicon substrate.

Yet another object of the present invention is to provide an improved hermetically sealed silicon package for a power semiconductor wafer which results from a superior bond between silicon and glass which form part of the package.

SUMMARY OF THE INVENTION

A new and improved method for making a hermetically sealed package for a power semiconductor wafer which is comprised of substantially entirely silicon materials selected to have coefficients of thermal expansion closely matching that of the power semiconductor wafer. In a preferred embodiment of the invention, the semiconductor wafer comprises a layer of silicon material having first and second device regions on respective sides thereof, such as a power diode. An electrically conductive cap and base, each including a layer of silicon material, are disposed in electrical contact with the first and second regions of the semiconductor device, respectively. An electrically insulating sidewall is provided to cooperate with the base and cap to form an enclosure for the diode. To this end, the electrically insulative sidewall of silicon material surrounds the semiconductor wafer, is spaced from an edge thereof, and is bonded to the cap and base for hermetically sealing the package An electrical passivant is disposed on an edge of the semiconductor wafer adjoining the first and second device regions for preventing electrical breakdown between the cap and base An arc suppressant is disposed within the package between the semiconductor wafer edge and the sidewall for preventing electrical arcing between the base and cap.

The method for making the above package incorporates a novel technique for bonding silicon glass to silicon in accordance with this invention. Specifically, this bonding technique is used to form a bond between the above-noted electrically conductive silicon base and the insulating glass sidewall, which bond forms a critical part of the hermetic seal of the package. The technique for bonding the glass to the silicon comprises essentially placing the members to be bonded in contact with each other and preferably under a slight pressure, heating the members to a temperature at which the glass softens sufficiently to wet the silicon surface (approximately 850°) and holding this temperature for a predetermined holding period sufficient to allow adequate wetting of the silicon surface to take place (approximately at least 10 minutes). This bond is formed without the use of electrostatic bonding potentials. The members are then allowed to cool to complete the bond.

BRIEF DESCRIPTION OF THE DRAWINGS

While the specification concludes with claims defining the features of the invention that are regarded as novel, it is believed that the invention, together with further objects thereof, will be better understood from a consideration of the following in conjunction with the drawing figures, in which:

FIG. 1 is a partial cross-sectional view of a diode implemented in a sealed package; and FIG. 2 is flow diagram illustrating the process steps for forming a direct bond between a silicon glass and a silicon substrate in accordance with the invention.

DETAILED DESCRIPTION OF THE INVENTION

As alluded to hereinabove, the subject of this invention is a method for bonding silicon glass directly to silicon. As such, the method has broad application to diverse technological arts and may be used for a wide variety of purposes. Notwithstanding that the method of the invention is broadly applicable for a wide variety of uses and purposes, it will be specifically described in conjunction with the making of a semiconductor package of the type disclosed in the aforementioned U.S. Pat. No. 4,745,455.

Before describing in detail the novel method of this invention for forming a direct bond between glass and silicon, a brief review of the structure of the semiconductor package disclosed in the aforementioned application will now be given with reference to FIG. 1.

Referring to FIG. 1, a portion of a diode 20 includes a semiconductor wafer 22 in the form a layer of silicon crystal material housed in a hermetically sealed, silicon package 24. Chip 22 includes an N-type cathode region 26 overlying a P-type anode region 28. Package 24 includes an electrically conductive base 30, an electrically conductive cap 32, an electrically insulative sidewall 34, an electrical passivant 36 and an arc suppressant 38, each preferably comprising a silicon material. Base 30 comprises a layer of low-resistivity silicon material, preferably a highly-doped silicon, and is bonded to and disposed in electrical contact with anode region 28 of wafer 22 at a junction 40. Cap 32 also comprises a highly-doped, low-resistivity silicon, and is bonded to and disposed in electrical contact with cathode region 26 of wafer 22 at a junction 42. Cap 32 and base 30 each are preferably doped with P type dopants such as aluminum, boron or gallium, or N type dopants such as arsenic, phosphorous or antimony. The concentration of dopants is selected to provide cap 32 and base 30 with a low resistivity (on the order of 4 milli-ohm centimeters). Because cap 32 and base 30 each comprises silicon, each exhibits a coefficient of thermal expansion close in value to that of semiconductor wafer 22.

Sidewall 34 is generally annular in shape and includes a layer portion 34a disposed between base 30 and cap 32 and an outer portion 34b surrounding package 24. Sidewall layer portion 34a surrounds wafer 22, includes an edge 34c spaced apart from an edge 22a of the wafer, and is bonded to cap 32 at a junction 48, and base 30 at a junction 50, so as to hermetically seal package 24 Sidewall outer portion 34b includes a three-lobed edge 34d surrounding the outside of package 24 and adjoining base 30 and cap 32. Sidewall 34 comprises premolded silicon glass selected to have a coefficient of thermal expansion close to that of silicon wafer 22. As is known to those skilled in the art, the coefficient of thermal expansion of silicon glass is controlled by selecting the quantity of additives, such as boron oxide ($B_2O_3$) or sodium monoxide ($Na_2O$), which are added to the silicon glass.

Passivant 36 is fabricated directly on edge 22a of wafer 22, and preferably comprises a polyimide, a silicone room-temperature vulcanizing rubber (RTV) or amorphous silicon. Arc suppressant 38, preferably comprising alumina ($Al_2O_3$), silicon dioxide ($SiO_2$), or RTV, is disposed within package 24 between sidewall layer edge 34c and wafer edge 22. With arc suppressant materials such as alumina and silicon dioxide whose expansion coefficients are similar to those of the rest of the package, it is preferred to fill the space between the sidewall and the wafer edge with the arc suppressant. With materials such as RTV which have a significantly greater coefficient of thermal expansion than the rest of the package and which are inserted at room temperature, it is preferred to leave a void which is sufficient to allow the RTV to expand at the device operating temperatures to fill the space. With RTV, the space which is not occupied by the RTV should be evacuated in order that expanding RTV will not be compressing a gas therein and thereby exerting excessive pressure. An aperture 52, shown sealed with a low temperature lead-tin eutectic, is disposed in cap 32 for inserting arc suppressant 38 into package 24. As an alternative to inserting the arc suppressant through the aperture 52 after the package is otherwise sealed, the arc suppressant may be inserted in the package prior to placement of and sealing the cap 32 to the semiconductor device and the sidewall. This procedure is particularly advantageous with RTV which is inserted in the package at less than the operating temperature of the device whereby it is desirable to leave a uniform gap between the top of the RTV and the cap. By inserting the RTV into the package prior to the placement and sealing of the cap, the existence of and the uniformity of this gap can be ensured whereas inserting RTV through the aperture 52 may result in uneven distribution of the RTV within the space surrounding the wafer with the result that no gap may exist in some locations with the result that thermal expansion of the RTV might have detrimental effects on the package. Where the package is designed to be secured in a circuit by the application of pressure to the base and cap, the RTV may be allowed to fill the space between the wafer and the sidewall at room temperature provided the pressure it will exert as a result of thermal expansion at the device operating temperature is low enough to ensure that the device clamping force will prevent damage from the RTV's expansion force.

In use, cap 32 serves as a cathode contact for diode 20, while base 30 serves as an anode contact for the diode. The silicon material of the cap and base are the structural portions of the external terminals of the device, but may have non-structural metallic or other coatings (not shown) thereon as may be considered desirable for passivation or to provide solderability. External electrical leads (not shown) are soldered directly to cap 32 or base 30, as required. Passivant 36 functions to control the electric field developed across the junction between cathode region 26 and anode region 28, thereby preventing electrical breakdown between cap 32 and base 30. Arc suppressant 38 functions to suppress arcing between cap 32 and base 30. Lobed edge 34d of outer sidewall portion 34b functions to increase the length of the current creep path, indicated by dashed line 54, between cap 32 and base 30 along the outside edge of the package. It will be appreciated that the shape of lobed edge 34b is only important in so far as it increases the length of current creep path 54. It will be further appreciated that those components of package 24 which don't necessarily comprise silicon materials (i.e., the bonds at junctions 40, 42, 48 and 50, passivant 36 and arc suppressant 38) include only a small percentage by volume of the package and therefore don't noticeably affect the functional characteristics of the package.

There is thus provided a hermetically sealed, compact semiconductor package 24 comprising substantially entirely silicon materials having coefficients of thermal expansion close in value to that of semiconductor wafer 22. Package 24, due to the nature of its structure, exhibits a high ratio of surface area to volume. This ratio, combined with good thermal conductivity of the silicon package components, makes package 24 efficient to cool.

The package of FIG. 1 is constructed in accordance with the following procedure. To begin the construction of the package, a novel method of bonding the annular silicon glass sidewall 34 directly to the silicon base 30 is outlined in FIG. 2. It should be repeated at the outset that the silicon glass sidewall is intended to cooperate with the base 30 and cap 32, as seen in FIG. 1, to form a sealed enclosure which houses the wafer 22. To this end, the portion 34a of the sidewall provides upper and lower lands to which the peripheral portions of the cap 32 and base 30 are bonded at junctions 48 and 50, respectively. The glass sidewall 34 is selected to have a coefficient of thermal expansion to closely match that of the silicon material used to make the semiconductor device 22, the cap 32 and base 30. As indicated above, the coefficient of thermal expansion of the silicon glass sidewall is controlled by selecting the quantity of additives, such as boron oxide ($B_2O_3$) or sodium monoxide ($Na_2O$), which are added to the silicon glass. In the preferred embodiment, glass sold under the trademark PYREX 7740 is used with good results. Having properly selected the glass sidewall material 34, it is bonded to the silicon base 30 in accordance with the flow diagram of FIG. 2 as follows. The base and sidewall are first prepared (Step 200) by rinsing in methanol and then in deionized water; this removes surface dirt and grease. The members are then dried with clean air.

The base 30 is then supported on a suitable carrier in a heating oven of conventional design and the annular sidewall is placed over the base, as shown in FIG. 1 (Step 201). While it is preferably to apply a small pressure to urge the base and sidewall together, the weight of the sidewall on the base will usually suffice without application of other forces. Thus, the bond is formed without the use of electrostatic bonding potentials. If more force than is provided by the weight of the glass alone (typically 0.03 psi) in a package for a 3 inch wafer having a ¼ inch wide annular bond between the glass sidewall and the silicon base 30, a plate of graphite or other appropriate material may be placed on top of the glass to provide additional force. This pressure is preferably less than 10 pounds per square inch (psi) and more preferably, less than 1 psi, since the plate itself must also be heated during the bonding process, thus, increasing both the power required and and the volume occupied. The members are then heated in the oven to a temperature where the glass sidewall 34 becomes sufficiently soft to wet the surface of the silicon base 30 without flowing (step 202). This occurs at approximately 850° C. and may be done in a belt furnace, if desired. If the temperature is increased above this point, to any great degree, the glass may soften enough to lose its form. This temperature is then maintained for a predetermined holding period of at least 10 minutes (step 203). This time may be increased to 1 hour without causing unsatisfactory results. Beyond the 1 hour time, no increases in the quality of the bond have been noted. The base and sidewall members are then cooled to complete the bond (step 204).

The above process results in an exceptionally strong hermetic seal between the silicon glass sidewall 34 and the silicon base 30 and provides an open cavity suitable for containing a silicon semiconductor wafer.

The semiconductor device 22 which has been previously prepared (including affixing of the passivant 36 to control electric fields) is next mounted within the open cavity to the base 30 at the junction 40 by means of a lead alloy solder, an aluminum-silicon alloy solder or a diffusion bond. A preferred lead alloy solder comprises, for example, an alloy of 92.5% lead, 5% tin and 2.5% silver. A preferred diffusion bond is formed by 1) sputtering copper on the mating surfaces, and 2) holding these surfaces in intimate contact at suitably high temperatures. It is to be understood that junction 40 is made by conventional techniques which do not require the use of a temperature as high as that employed to provide the direct glass to silicon bond previously described with reference to FIG. 2.

Next, the cap 32 is attached to the upper land of the portion 34a of the sidewall (FIG. 1) at junction 48 and to the cathode 26 of the device 22 at junction 42. Junctions 48 and 42 are preferably formed using the solder or diffusion bonds described above with respect to junction 40 by conventional techniques. Again, in forming the bonds at junctions 48 and 42, the temperatures are not to exceed those at which damage to previously formed junctions will take place.

Lastly, the arc suppressant material 38 described previously is inserted into the space formed intermediate the sidewall 34, cap 32, base 30, and passivation layer 36 (FIG. 1). This is done by passing the arc suppressant 38 through the opening 52 and later sealing the opening with an appropriate material.

There has thus been described a method for making a semiconductor package which has an improved glass to silicon bond formed without the need for intermediate layers which are subject to deterioration. The junction 50 between the sidewall 34 and base 30 provides a superior hermetic seal which is less subject to failure and which thereby improves the overall reliability of the package.

While the exact nature of the bond formed by this technique is not completely understood, it appears that no intermediate third phase or layer is formed between the silicon and glass Undoubtedly, the close match of thermal coefficients of expansion between the silicon and glass members plays an important role in precluding a shattering of the glass as the temperature of the members is brought back to ambient values. After bonding, the structure can be cycled between a very low temperature ($-55°$ C.) and elevated temperatures (several hundreds of degrees C.) without any damage.

While the preferred techniques for fabrication of the glass to silicon bond according to the invention has been illustrated and described, it will be clear that the invention is not so limited. For example, while the techniques of the invention have been described with respect to a diode, it will be appreciated that such techniques are equally applicable to other devices such a silicon controlled rectifiers (SCR's). Numerous modifications, changes, variation, substitutions and equivalents will occur to those skilled in the art without departing from the spirit and scope of the present invention. Accordingly, it is intended that the invention herein be limited only by the scope of the appended claims.

What is claimed is:

1. A method of bonding a glass member to a silicon member comprising:
    placing the silicon member in contact with the glass member, said glass member comprising a glass selected to have a thermal coefficient of expansion which closely matches the thermal coefficient of expansion of said silicon member;
    heating said members to a temperature of approximately 850° C. at which said glass wets said silicon member but does not soften enough to lose its form;
    holding said members at said temperature without the use of an electrostatic bonding potential for at least a time sufficient to permit said glass to wet said silicon member without softening enough to lose its form; and
    cooling said members to complete a direct bond between said glass member and said silicon member without forming an intermediate third phase or layer between said glass member and said silicon member.

2. The method of claim 1 which comprises maintaining a contact pressure of less than 10 psi on said glass member in the direction of said silicon member to aid in bond formation.

3. The method of claim 2 wherein:
    said contact pressure is less than 1 psi.

4. The method of claim 3 wherein:
    said contact pressure is provided by the weight of said glass member alone.

5. The method of claim 1 wherein:
    said temperature is maintained for a period of at least 10 minutes.

6. The method of claim 1 which comprises, prior to heating, cleaning contacting surfaces of said members.

7. The method of claim 6 wherein:
    said cleaning includes rinsing said members in methanol and deionized water and drying said members.

8. A method for making an open cavity for holding a semiconductor wafer comprising:
    providing a conductive, silicon terminal layer having two opposing substantially planar major surfaces;
    providing a separate, electrically insulating sidewall of silicon glass selected to have a thermal coefficient of expansion which closely matches the thermal coefficient of expansion of said silicon terminal layer;
    bonding said sidewall to said silicon terminal layer by:
        placing said sidewall in direct contact with one of said major surfaces of said silicon terminal layer with a contact pressure of less than 10 psi,
        heating said sidewall and said silicon terminal layer to a temperature of approximately 850° C. whereat said sidewall wets said silicon terminal layer but below the temperature at which said sidewall begins to soften enough to lose its form.
        maintaining said sidewall and said silicon terminal layer at said temperature in the absence of electrostatic bonding potentials for a holding period sufficient in duration for said glass to come into direct bonding contact with said silicon terminal layer without forming an intermediate third phase or layer between said glass and said silicon terminal layer, and
    cooling said sidewall and silicon terminal layer to complete the bonding process.

9. The method recited in claim 8 wherein:
    said contact pressure is less than 1 psi.

10. The method recited in claim 8 wherein:
    said contact pressure is provided by the weight of said glass alone.

* * * * *